(12) United States Patent
Kadohata et al.

(10) Patent No.: US 6,606,785 B1
(45) Date of Patent: Aug. 19, 2003

(54) METHOD OF MOUNTING ELECTRONIC COMPONENTS AND APPARATUS THEREFOR

(75) Inventors: Satoshi Kadohata, Fukuoka (JP); Jun Yamauchi, Fukuoka (JP); Yasuhiro Kashiwagi, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/000,850

(22) Filed: Dec. 30, 1997

(30) Foreign Application Priority Data

Jan. 6, 1997 (JP) .............................. 9-000064

(51) Int. Cl.[7] ................................. B23P 19/00
(52) U.S. Cl. ............................ 29/740; 29/742; 29/832; 29/833
(58) Field of Search ....................... 29/740, 742, 832, 29/833, 836

(56) References Cited

U.S. PATENT DOCUMENTS

| | | | | |
|---|---|---|---|---|
| 4,914,809 A | * | 4/1990 | Fukai et al. | 29/740 |
| 4,984,354 A | * | 1/1991 | Mohara et al. | 29/740 |
| 5,201,696 A | * | 4/1993 | Kinback et al. | 483/54 |
| 5,253,414 A | * | 10/1993 | Gaudette et al. | 29/740 |
| 5,377,405 A | * | 1/1995 | Sakuraie et al. | 29/833 |

FOREIGN PATENT DOCUMENTS

| | | | |
|---|---|---|---|
| EP | 0 821 549 A2 | * | 1/1998 |
| JP | 1-241889 | * | 9/1989 |
| JP | 2-90596 | | 3/1990 |
| JP | 02132897 | * | 5/1990 |
| JP | 4-94599 | | 3/1992 |
| JP | 4-321243 | * | 11/1992 |

* cited by examiner

*Primary Examiner*—Carl J. Arbes
(74) *Attorney, Agent, or Firm*—McDermott, Will & Emery

(57) ABSTRACT

For implementing a method of mounting electronic components, and an apparatus therefor, which has a much reduced tact time, the nozzles $3a$, $3b$, $3c$, $3d$, $3e$ and $3f$ are kept in holes 5 provided in a straight line row in nozzle stocker 4 in the order of use sequence. When the type of electronic components to be mounted on a circuit board changes, transfer head 1 has to go to a place above the nozzle stocker 4 to replace the nozzle. In the invented mounting method, and mounting apparatus, the transfer head 1 is required to move only to a place above the next nozzle $3b$ after returning the used nozzle $3a$ to a hole 5. Thus the stroke L of transfer head 1 needed for the nozzle exchange is significantly reduced, and the nozzle may be replaced within a short time.

19 Claims, 7 Drawing Sheets

| Mounting sequence | Parts code | Mounting location | | | Parts feeder | Nozzle |
|---|---|---|---|---|---|---|
| | | X | Y | θ | | |
| 1 | AAA | X1 | Y1 | θ1 | 17a | 3a |
| 2 | AAA | X2 | Y2 | θ2 | 17a | 3a |
| 3 | AAA | X3 | Y3 | θ3 | 17a | 3a |
| 4 | AAB | X4 | Y4 | θ4 | 17c | 3a |
| 5 | AAB | X5 | Y5 | θ5 | 17c | 3a |
| 6 | ABC | X6 | Y6 | θ6 | 17e | 3b |
| 7 | ABC | X7 | Y7 | θ7 | 17e | 3b |
| 8 | ABC | X8 | Y8 | θ8 | 17e | 3b |
| 9 | ABD | X9 | Y9 | θ9 | 17d | 3c |

METHOD OF MOUNTING ELECTRONIC COMPONENTS AND APPARATUS THEREFOR

FIELD OF THE INVENTION

The present invention relates to a method of mounting electronic components on a circuit board, and a mounting apparatus.

BACKGROUND OF THE INVENTION

In an electronic component mounting apparatus, an electronic component provided on parts feeder is picked up by sucking with a nozzle of transfer head to be mounted on a circuit board.

The size of electronic components supplied on parts feeder widely varies from quite large to tiny depending on type of component. Therefore, the nozzle has to be replaced from time to time with other nozzle that fits to a specific component type. For the nozzle exchange, a transfer head goes to a place above a nozzle stocker and makes up and down action.

FIG. 7 is a chart used for explaining a procedure of the nozzle exchange in a prior art electronic components mounting apparatus. Underneath a transfer head 1 is a nozzle holder 2 for holding a nozzle 3a. A nozzle stocker 4 is provided with several number of holes 5 (six holes in the present exemplary apparatus) arranged in a straight line row stretching lengthwise; in the respective holes nozzles 3b–3f are kept. The nozzles are put on use sequentially in the order 3a, 3b, 3c, 3d, 3e and 3f. In FIG. 7, the transfer head 1 is holding a nozzle 3a, which was kept in the leftmost hole 5 of nozzle stocker 4; therefore the leftmost hole 5 is vacant.

For replacing the nozzle 3a now on transfer head 1 with a nozzle 3b which is kept in the rightmost hole 5, the transfer head 1 goes above the leftmost vacant hole 5 and makes an up and down action to return the nozzle 3a to the hole 5 (see nozzle 3a illustrated with broken lines), and then goes to a place above the nozzle 3b (stroke L1) and makes another up and down action there to attach the nozzle 3b on nozzle holder 2. After the nozzle exchange is thus finished, the transfer head 1 begins a next operation of mounting electronic components using the nozzle 3b.

For replacing the nozzle 3b with a nozzle 3c, the transfer head 1 goes to a place above the rightmost hole 5 to return the nozzle 3b to the hole 5 in a same manner as described above, and then goes above the nozzle 3c (stroke L2) to attach the nozzle 3c on nozzle holder 2. Exchange to a nozzle 3d, to a nozzle 3e and to a nozzle 3f are conducted in a same manner as described above.

However, in the conventional method where the nozzles 3a–3f are kept in the holes 5 without assuming any specific order, the strokes L1, L2, L3, ... of transfer head 1 required for nozzle exchange are considerably long, and the tact time for nozzle exchange becomes long to the deterioration in efficiency of components mounting work. In some practical cases, the nozzle has to be replaced for more than 10 times per one circuit board. Reducing the tact time required for nozzle exchange is therefore a key factor in improving the mounting efficiency.

The present invention aims to present a method of mounting electronic components with a significantly reduced tact time, as well as an apparatus for mounting electronic components by the same method.

SUMMARY OF THE INVENTION

In the invented mounting method, nozzles are kept in a nozzle stocker disposed in the order of use sequence, and the nozzles are replaced according to the order in which the nozzles are disposed.

When replacing nozzles, a transfer head may pick up and attach a nozzle located next to the nozzle just returned. The strokes needed for a transfer head to replace nozzles are significantly reduced, realizing a quick nozzle exchange.

BRIEF DESCRIPTION OF THE DRAWINGS

FIG. 3 is a mount data of an electronic component mounting apparatus in accordance with the first exemplary embodiment of the present invention.

DESCRIPTION OF THE PREFERRED EMBODIMENT

Embodiment 1

Figure 1:
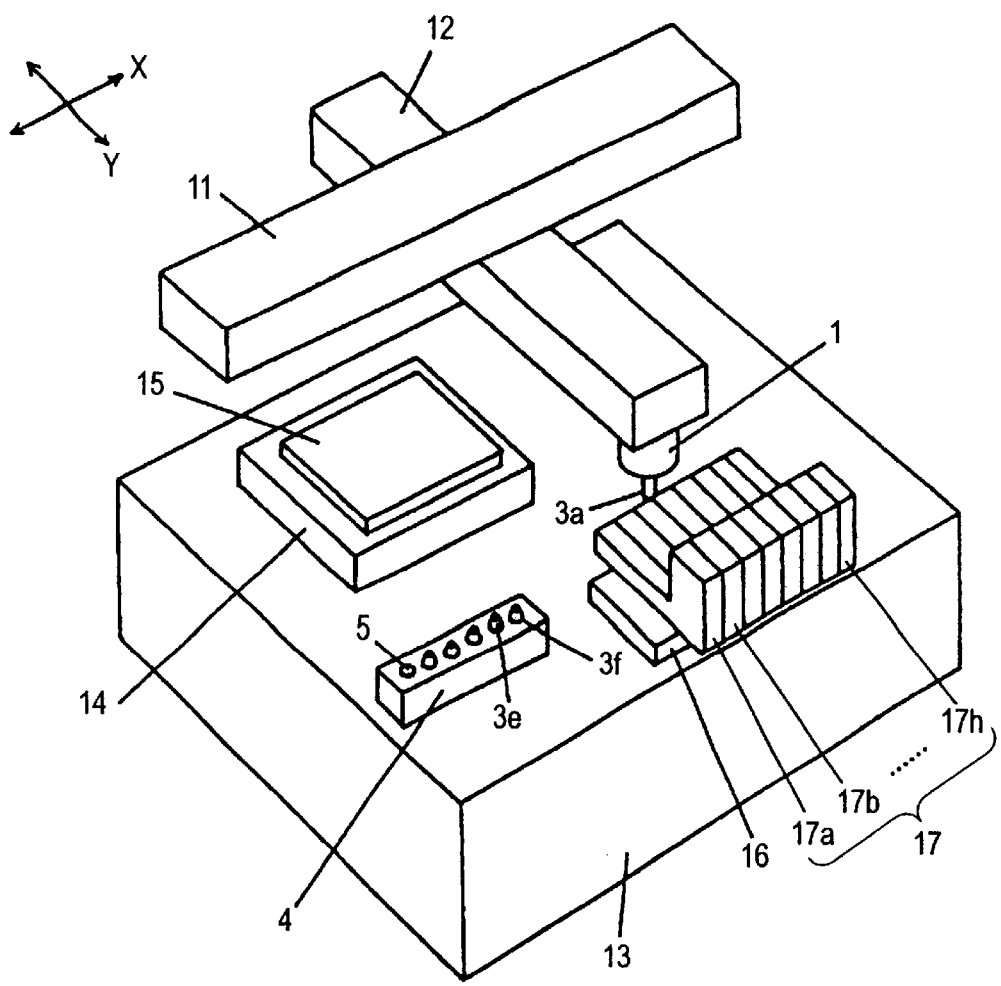
FIG. 1 is a perspective view of an electronic component mounting apparatus in accordance with a first exemplary embodiment of the present invention.
Figure 2:
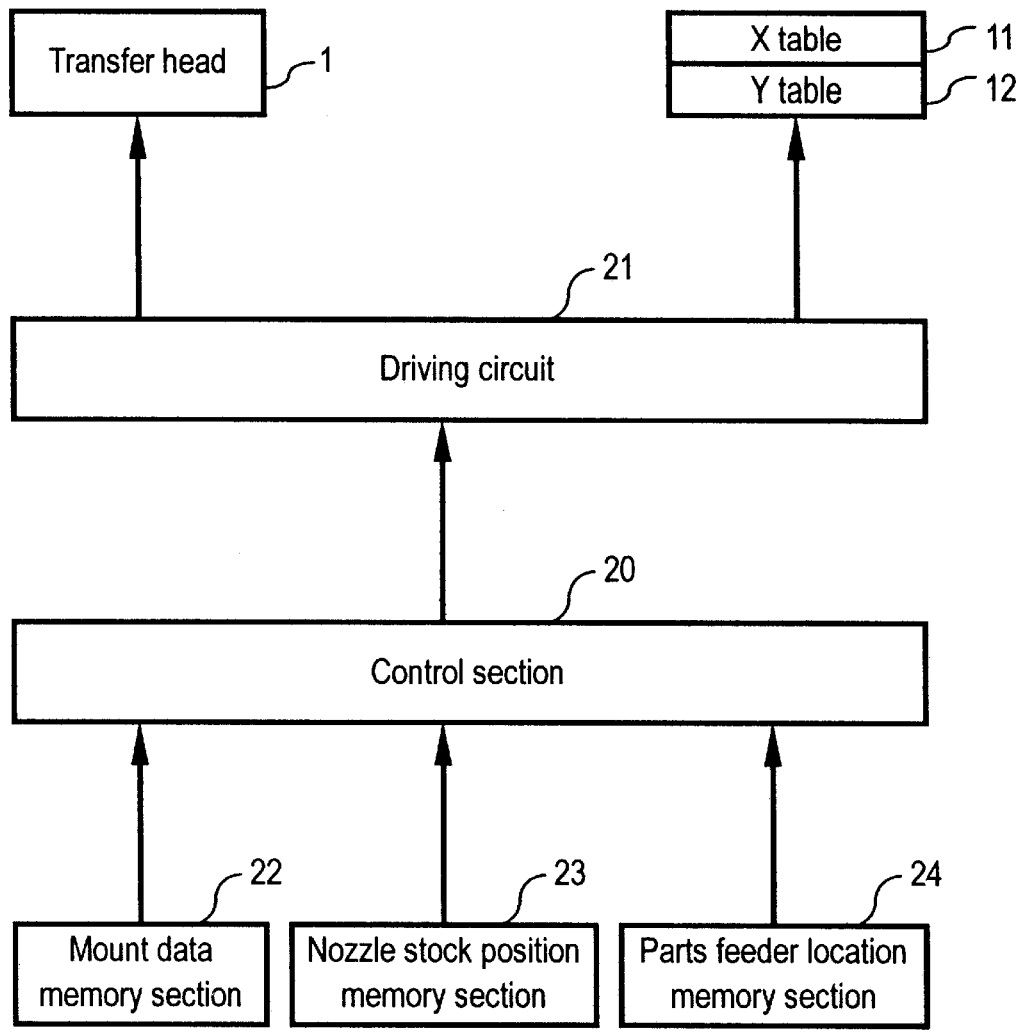
FIG. 2 is a block diagram showing the function of an electronic component mounting apparatus in accordance with the first exemplary embodiment of the present invention.
Figure 4:
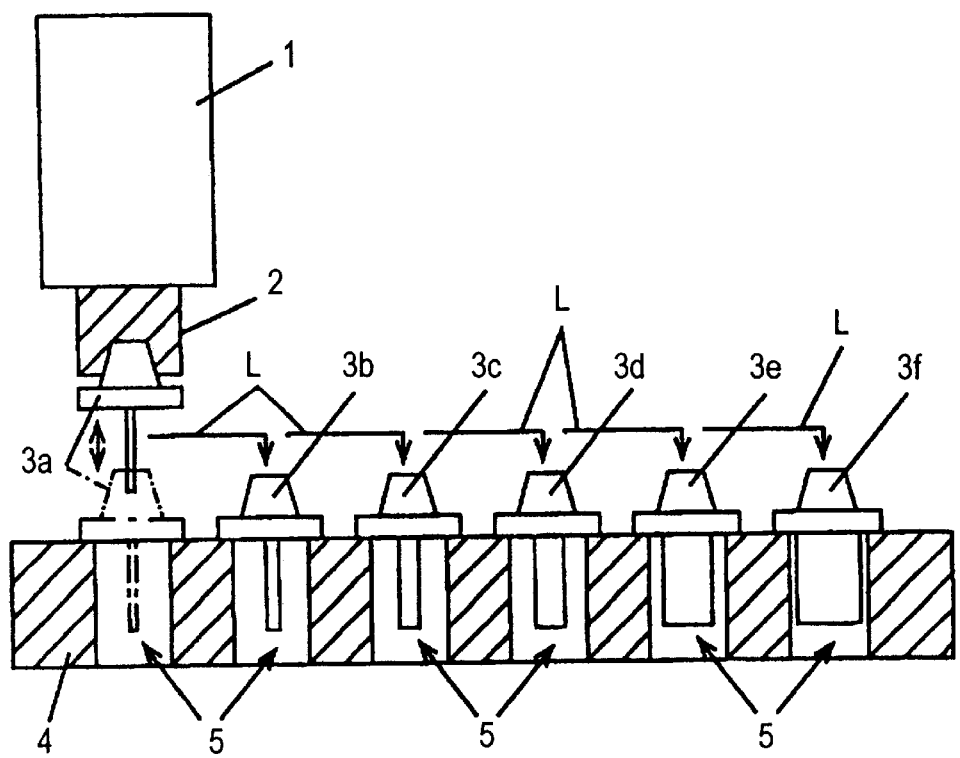
FIG. 4 is a chart showing a procedure of the nozzle exchange in an electronic component mounting apparatus in accordance with the first exemplary embodiment of the present invention.
Figure 5:
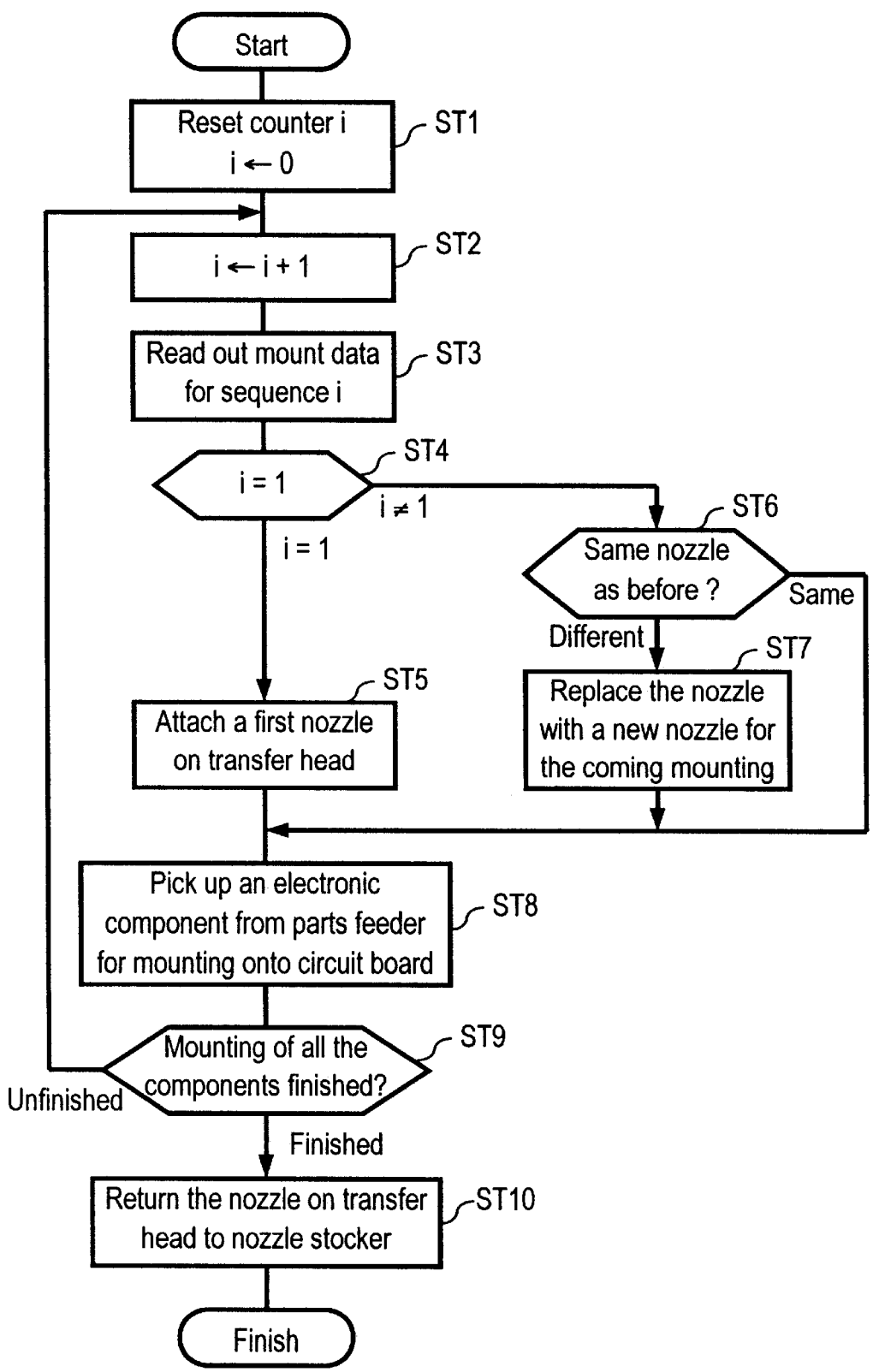
FIG. 5 is a flow chart showing the operation of an electronic component mounting apparatus in accordance with the first embodiment of the present invention.

FIG. 1 is a perspective view of an electronic component mounting apparatus in accordance with an exemplary Embodiment 1 of the present invention, FIG. 2 is a block diagram showing function of the electronic component mounting apparatus, FIG. 3 is a mount data, FIG. 4 is a chart showing a procedure of the nozzle exchange, and FIG. 5 is a flow chart showing operation of the electronic component mounting apparatus.

Figure 7:
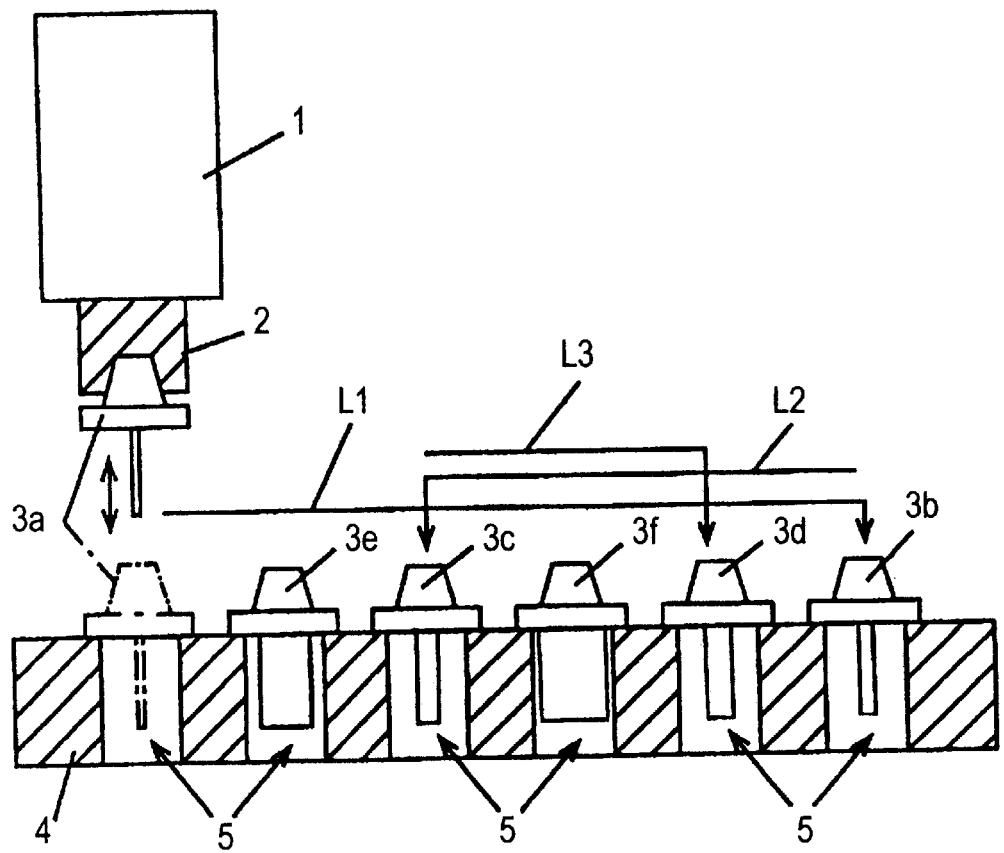
FIG. 7 is a chart showing a procedure of the nozzle exchange in a prior art electronic component mounting apparatus.

In the first place, the entire structure of the electronic component mounting apparatus is described referring to FIG. 1. In FIG. 1, those having the same functions as in FIG. 7, a prior art, are indicated using the same symbols. In FIG. 1, numeral 11 denotes an X table, 12 is a Y table disposed rightangled to the X table 11. A transfer head 1 is held on the Y table 12. The tranfer head 1 makes horizontal movements in X direction and Y direction by the action of X table 11 and Y table 12.

Numeral 13 represents a machine bed, on which a supporter 14 is provided for supporting a circuit board 15 with the position aligned. On a table 16 provided in the vicinity of the supporter 14, a plurality of parts feeders 17 (17a–17h) are provided. The parts feeders 17 dispense various types of electronic components. At a side of the table 16 is a nozzle stocker 4.

The nozzle stocker 4 has an oblong shape, in which a plurality of holes 5 are formed on a straight line for keeping nozzles 3a–3f in the order, as shown in FIG. 4. Presently, a nozzle 3a which was kept in the leftmost hole 5 is being attached to transfer head 1, therefore the hole 5 is empty. The nozzle is employed for mounting electronic components on circuit board 15 in the order 3a, 3b, 3c, 3d, 3e and 3f, so the nozzles are kept in the respective holes 5 in the order, from the left to right, 3a, 3b, 3c, 3d, 3e and 3f. The point is to have the nozzles 3a–3f kept in the holes 5 in the order of use sequence; therefore, for example, a first nozzle 3a may be stored in a hole 5 which is second from the left, followed by nozzles 3b–3e, and the last nozzle 3f in the leftmost hole 5.

FIG. 2 is a block diagram showing the function of electronic component mounting apparatus. In FIG. 2, numeral 20 denotes a control section for controlling the whole operation of electronic component mounting apparatus, 21 is a driving circuit for driving transfer head 1, X table 11 and Y table 12 in accordance with an instruction delivered from the control section 20. The control section 20 is coupled with a mount data memory section 22, a nozzle stock position memory section 23 and a parts feeder location memory section 24. Now, description is made on mount data stored in the mount data memory section 22, referring to FIG. 3. The mount data comprises; sequence of electronic components to be mounted on a circuit board, parts code specifying the type of electronic component, data of mounting coordinates (X, Y) and angle (θ) on a circuit board to be mounted, information for specifying a parts feeder dispensing the components, and information about a nozzle to be employed. The sequence of mounting electronic components on a circuit board is predetermined in line with the sequence of nozzle employment. In an exemplary mount data as shown in FIG. 3, a nozzle 3a is used in the first place for mounting electronic components indicated with parts codes AAA" and AAB", and then a nozzle 3b is used for mounting electronic components ABC". The nozzle stock position memory section 23 stores coordinates data which indicate stock position for each of the nozzles. The parts feeder location memory section 24 stores data on the coordinates of parts feeder location. The control section 20 mounts electronic components on a circuit board in accordance with information (data) stored in these memory sections.

In FIG. 1, the transfer head 1 attached with a nozzle 3a picks up an electronic component provided on the parts feeder 17 using the nozzle 3a by sucking with vacuum at the bottom tip, and then moves to a place above specified coordinates of a circuit board 15, and mounts the electronic component on the circuit board 15 by moving the nozzle 3a up and down.

When all of the electronic components mountable with the nozzle 3a are mounted on a circuit board, the transfer head 1 replaces the nozzle 3a with a nozzle 3b. The transfer head 1 goes, as shown in FIG. 4, above the leftmost hole 5 to return the used nozzle 3a by moving nozzle holder 2 up and down (see nozzle 3a illustrated with broken lines in FIG. 4).

Then, the transfer head 1 goes to a place above a nozzle 3b locating next to the nozzle 3a (stroke L) to have the nozzle 3b attached to nozzle holder 2 by moving the nozzle holder 2 up and down. Thenceforth the transfer head mounts electronic components supplied on parts feeder 17 onto circuit board 15 using the nozzle 3b.

When mounting of all the electronic components that can be mounted with the nozzle 3b is finished, the transfer head 1 replaces its nozzle 3b with a nozzle 3c. The transfer head 1 goes, in a same way as described in the above, to a place above the empty hole 5 which is located second from the left to return the nozzle 3b there, and then goes to a place above a nozzle 3c which is placed next to the nozzle 3b (stroke L) to have the nozzle 3c attached to nozzle holder 2.

Thus the mounting of various electronic components on a circuit board 15 is conducted by transfer head 1, replacing the nozzle 3c with a nozzle 3d, the nozzle 3d with a nozzle 3e, the nozzle 3e with a nozzle 3f, in a same way as described in the above (each of the respective strokes is equivalent to L). At any case of the nozzle exchange, the transfer head 1 is required to go only to a nozzle which is placed next to a hole in which the used nozzle was returned. The running stroke L is significantly shorter than that in the conventional cases as shown in FIG. 4, which means that the nozzle exchange may be finished swiftly.

Now in the following, an electronic component mounting method is practically described referring to a flow chart, FIG. 5. When a circuit board 1 is placed on supporter 14, at that time the transfer head 1 is not attached with a nozzle, a counter i is reset and then added with 1 (ST1, ST2), and mount data of mounting sequence represented by i is read out (ST3). Then, confirmation is made whether the value i is 1 or not; viz. whether it is mounting of a first electronic component (ST4). If it is mounting of a first electronic component the transfer head 1 is not equipped with a nozzle; so a nozzle 3a to be used for the first mounting is attached to transfer head 1 (ST5), and an electronic component is picked up from a parts feeder 17a, which is designated by mount data, for mounting onto a circuit board (ST8). If it is mounting of a second electronic component and after, confirmation is made as to whether or not the same nozzle as before is to be used (ST6); when a different nozzle is needed, the existing nozzle is replaced with other nozzle (ST7), when the same nozzle is usable it proceeds to ST8 as it is. When the ST8 is completed, confirmation is made as to whether mounting of all the electronic components shown in mount data is finished (ST9); if it is unfinished, the steps ST2–ST8 are repeated, if it is finished the nozzle presently attached to transfer head 1 is returned to nozzle stocker 4 (ST10) to complete the mounting of electornic components.

Embodiment 2

Figure 6:
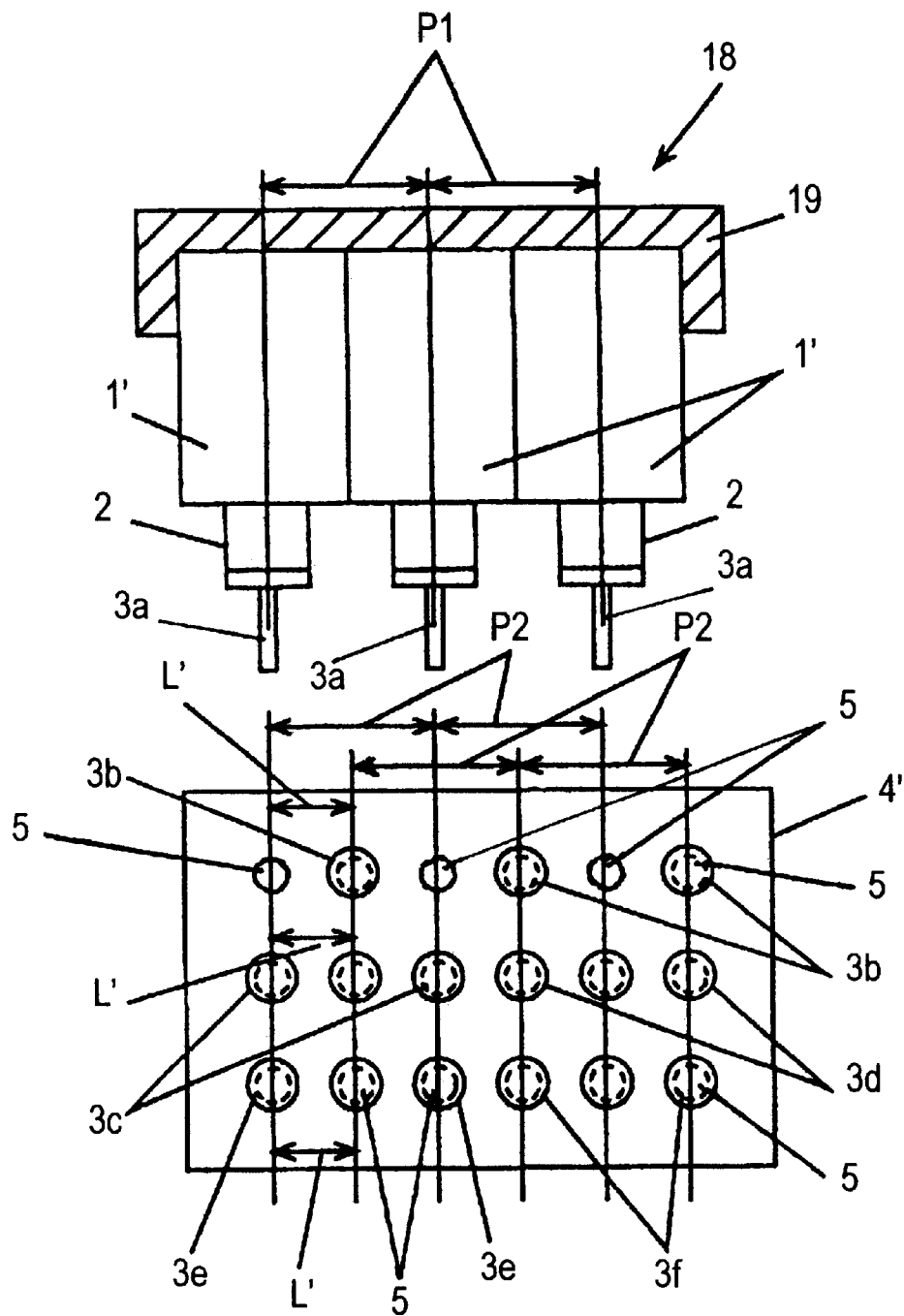
FIG. 6 is a chart showing a transfer head unit and a nozzle stocker of an electronic component mounting apparatus in accordance with a second exemplary embodiment of the present invention.

FIG. 6 is a chart used to explain a transfer head unit and a nozzle stocker of an electronic component mounting apparatus in accordance with a second exemplary embodiment of the present invention. For the sake of convenience of explanation, the transfer head unit 18 is shown in a front elevation view while the nozzle stocker 4' in a plane view, in FIG. 6. The transfer head unit 18 is comprised of several pieces (3 pcs. in the present case) of transfer head 1' assembled together to form one single body with a bracket 19. So, the 3 pcs. of nozzles (eg. nozzle. 3a) may suck up three electronic components simultaneously or one after another, and transfer these components all at once from parts feeder 17 onto circuit board 15 for mounting. The nozzle stocker 4' is provided with holes 5 arranged in three rows of six columns; capable of storing 18 nozzles.

The transfer head unit 18 has a pitch P1 between nozzles. In the holes 5 of the nozzle stocker 4, nozzles 3a–3f are placed one after another type as shown in FIG. 6 (in the order, 3a, 3b, 3a, 3b, 3a, 3b, 3c, 3d, 3c, 3d, 3c, 3d, 3e, 3f, 3e, 3f, 3e, 3f). The pitch between the nozzles of a same type is P2. The pitch P1 and the pitch P2 are substantially the same so as the three nozzles may be replaced at once. For the sake of easy explanation here, the three transfer heads 1' are supposed to use nozzles of a same type (eg. nozzle 3a) at a same time.

The three transfer heads 1' replace the nozzles simultaneously in a same way as in Embodiment 1; the presently used three nozzles 3*a* are returned to three vacant holes 5 disposed after every other in the nozzle stocker 4', and then the three transfer heads 1' are moved to a place above nozzle 3*b* of the next use (transfer distance L') for nozzle replacing. Thus the stroke L' required for the transfer head 1' to move is significantly reduced, producing the same effects as in Embodiment 1.

According to the present invention, a transfer head may take a nozzle which is located next to a place at which a used nozzle was just returned to. This makes the stroke required for a transfer head to move for the nozzle replacing remarkably shorter, and the nozzle exchange may be finished within a short time.

What is claimed is:

1. An apparatus for mounting a plurality of electronic components on a circuit board, said apparatus comprising:
    a moveable transfer head for selecting one of a plurality of nozzles, each of said plurality of nozzles capable of being secured to said transfer head and capable of picking up a select set of said plurality of electronic components;
    a nozzle stocker having a plurality of compartments each of which is utilized to store one of said plurality of nozzles;
    a mounting data memory device for storing a predetermined mounting sequence for the plurality of electronic components to be mounted on the circuit board;
    a nozzle stock position memory device for storing data identifying which of said compartments of said nozzle stocker stores which of said plurality of nozzles; and
    a controller for controlling the operation of said movable transfer head in accordance with said predetermined mounting sequence, wherein said predetermined mounting sequence is designed such that when a currently selected nozzle attached to said movable transfer head is replaced in the compartment of said nozzle stocker corresponding to said currently selected nozzle, the next nozzle to be selected by said movable transfer head is in an adjacent compartment of said nozzle stocker,
    wherein said controller controls the operation of said movable transfer head such that each of said plurality of nozzles is selected by said movable transfer head only once during the mounting of said plurality of electronic components.

2. An apparatus for mounting a plurality of electronic components on a circuit board according to claim 1, wherein said nozzle stocker has an oblong shape and comprises a plurality of holes disposed in a straight line, each of said plurality of holes corresponding to one of said compartments.

3. An apparatus for mounting a plurality of electronic components on a circuit board according to claim 1, wherein said plurality of nozzles are stored in said nozzle stocker in order of sequence of use.

4. An apparatus for mounting a plurality of electronic components on a circuit board according to claim 1, wherein each of said nozzles picks up said electronic components by means of suction.

5. An apparatus for mounting a plurality of electronic components on a circuit board according to claim 1, further comprising a parts feeder for feeding said plurality of electronic components, said parts feeder having a plurality of feeder portions, each of which accommodates electronic components having a predetermined set of dimensions.

6. An apparatus for mounting a plurality of electronic components on a circuit board according to claim 5, wherein said mounting data further includes data identifying the nozzle to be utilized to pick up each of said plurality of electronic components.

7. An apparatus for mounting a plurality of electronic components on a circuit board utilizing a plurality of nozzles each being capable of being secured to a transfer head and capable of picking up a select set of said plurality of electronic components, said apparatus comprising:
    a moveable transfer head for selecting at least two nozzles of said plurality of nozzles simultaneously;
    a nozzle stocker having a plurality of compartments each of which is utilized to store one of said plurality of nozzles;
    a mounting data memory device for storing a predetermined mounting sequence for the plurality of electronic components to be mounted on the circuit board;
    a controller for controlling the operation of said movable transfer head in accordance with said predetermined mounting sequence, wherein said predetermined mounting sequence is designed such that when currently selected nozzles attached to said movable transfer head are replaced in the compartments corresponding to said currently selected nozzles, the next nozzles to be selected by said movable transfer head are in adjacent compartments to the nozzles just replaced by said moveable transfer head.

8. An apparatus for mounting a plurality of electronic components on a circuit board according to claim 7, wherein said nozzle stocker has an oblong shape and comprises a plurality of holes disposed in a straight line, each of said plurality of holes corresponding to one of said compartments.

9. An apparatus for mounting a plurality of electronic components on a circuit board according to claim 7, wherein said nozzle stocker further comprises a plurality of rows, each row comprising said plurality of holes disposed in a straight line.

10. An apparatus for mounting a plurality of electronic components on a circuit board according to claim 7, wherein said controller controls the operation of said movable transfer head such that each of said plurality of nozzles is selected by said movable transfer head only once during the mounting of said plurality of electronic components.

11. An apparatus for mounting a plurality of electronic components on a circuit board according to claim 7, wherein each of said nozzles picks up said electronic components by means of suction.

12. An apparatus for mounting a plurality of electronic components on a circuit board according to claim 7, further comprising a parts feeder for feeding said plurality of electronic components, said parts feeder having a plurality of feeder portions, each of which accommodates electronic components having a predetermined set of dimensions.

13. An apparatus for mounting a plurality of electronic components on a circuit board according to claim 12, wherein said mounting data further includes data identifying the nozzles to be utilized to pick up each of said plurality of electronic components.

14. An apparatus for mounting a plurality of electronic components on a circuit board according to claim 7, wherein a pitch between the at least two nozzles secured to said moveable transfer head substantially equals the pitch between compartments of said nozzle stocker so that multiple nozzles can be selected and replaced simultaneously by said moveable transfer head.

15. The apparatus of claim 7, wherein said currently selected nozzles are configured to pick up the same said select set of said plurality of electronic components.

16. The apparatus of claim 7, wherein said plurality of compartments are configured such that the compartments of said currently selected nozzles are separated from each other by at least one compartment of the nozzle stocker.

17. A method for mounting a plurality of electronic components on a circuit board, said method comprising the steps of:

selecting one of a plurality of nozzles via a moveable transfer head, each of said plurality of nozzles capable of being secured to said transfer head and capable of picking up a select set of said plurality of electronic components;

storing said plurality of nozzles in a nozzle stocker having a plurality of compartments, each of said plurality of nozzles being stored in one of said compartments;

storing mounting data in a memory device, said mounting data comprising a predetermined mounting sequence for the plurality of electronic components to be mounted on the circuit board;

storing nozzle stock position data identifying which of said compartments of said nozzle stocker stores which of said plurality of nozzles;

controlling the operation of said movable transfer head in accordance with said predetermined mounting sequence, wherein said predetermined mounting sequence is designed such that when a currently selected nozzle attached to said movable transfer head is replaced in the compartment of said nozzle stocker corresponding to said currently selected nozzle, the next nozzle to be selected by said movable transfer head is in an adjacent compartment of said nozzle stocker, and controlling the operation of said movable transfer head such that each of said plurality of nozzles is selected by said movable transfer head only once during the mounting of said plurality of electronic components.

18. A method for mounting a plurality of electronic components on a circuit board according to claim 17, wherein said nozzle stocker has an oblong shape and comprises a plurality of holes disposed in a straight line, each of said plurality of holes corresponding to one of said compartments.

19. A method for mounting a plurality of electronic components on a circuit board according to claim 17, further comprising the step of storing said plurality of nozzles in said nozzle stocker in order of sequence of use.

\* \* \* \* \*